: US006126336A

United States Patent [19]
Ferrante

[11] Patent Number: 6,126,336
[45] Date of Patent: Oct. 3, 2000

[54] APPARATUS FOR THE COMPLETE, CONTINUOUS SEPARATION OF A MIXTURE OF PHOTOPOLYMERS AND WATER WITH A MEMBRANE AND FILTER, FOR THE MAKING OF FLEXIBLE PLATES USEFUL IN PRINTING

[75] Inventor: Mario Ferrante, Laxou, France

[73] Assignee: Photomeca/Egg, Pompey, France

[21] Appl. No.: 08/869,026

[22] Filed: Jun. 4, 1997

[30] Foreign Application Priority Data

Jun. 14, 1996 [FR] France .................................. 96 07583

[51] Int. Cl.⁷ ...................................................... G03D 3/04
[52] U.S. Cl. .......................... 396/565; 396/626; 396/631; 210/85; 210/97; 210/121; 210/122; 210/167; 210/177; 210/179; 210/127; 210/248; 210/255; 210/196; 210/197; 210/387; 210/400
[58] Field of Search ..................................... 101/463, 464, 101/465, 467, 456; 210/97, 103, 104, 121, 122, 143, 194, 171, 167, 248, 255, 387, 400, 85, 127, 177, 179, 196, 197; 396/604, 617, 625, 626, 631, 627

[56] References Cited

U.S. PATENT DOCUMENTS

| | | |
|---|---|---|
| 4,370,406 | 1/1983 | Jones ........................................ 430/331 |
| 4,752,283 | 6/1988 | Copeland et al. ......................... 494/37 |
| 4,796,042 | 1/1989 | Mappin et al. ........................... 354/324 |
| 5,124,736 | 6/1992 | Yamamoto et al. ..................... 354/325 |
| 5,474,877 | 12/1995 | Suzuki ..................................... 430/325 |

FOREIGN PATENT DOCUMENTS

| | | |
|---|---|---|
| 0254550 | 1/1988 | European Pat. Off. . |
| 0430233 | 6/1991 | European Pat. Off. . |
| 0642058 | 3/1995 | European Pat. Off. . |
| 2709192 | 2/1995 | France . |
| 3143106 | 5/1983 | Germany . |
| 29517588 | 2/1996 | Germany . |
| WO 9606382 | 2/1996 | WIPO . |

*Primary Examiner*—Robert J. Popovics
*Attorney, Agent, or Firm*—Gary M. Cohen

[57] ABSTRACT

An etching device for preparing flexible blocks which can be used for printing in flexography, typography or dry offset generally includes an etching tank containing a bath (22) and brushes (3), a stirring and heating device, and an overfill system (20) for discharging the solution from the etching tank through an outlet duct (21) to a separation device. The separation device includes a reception vat (14) having an upper part which is equipped with a device (10) for separating the water and the polymer, and at least one filtering membrane (7).

15 Claims, 1 Drawing Sheet

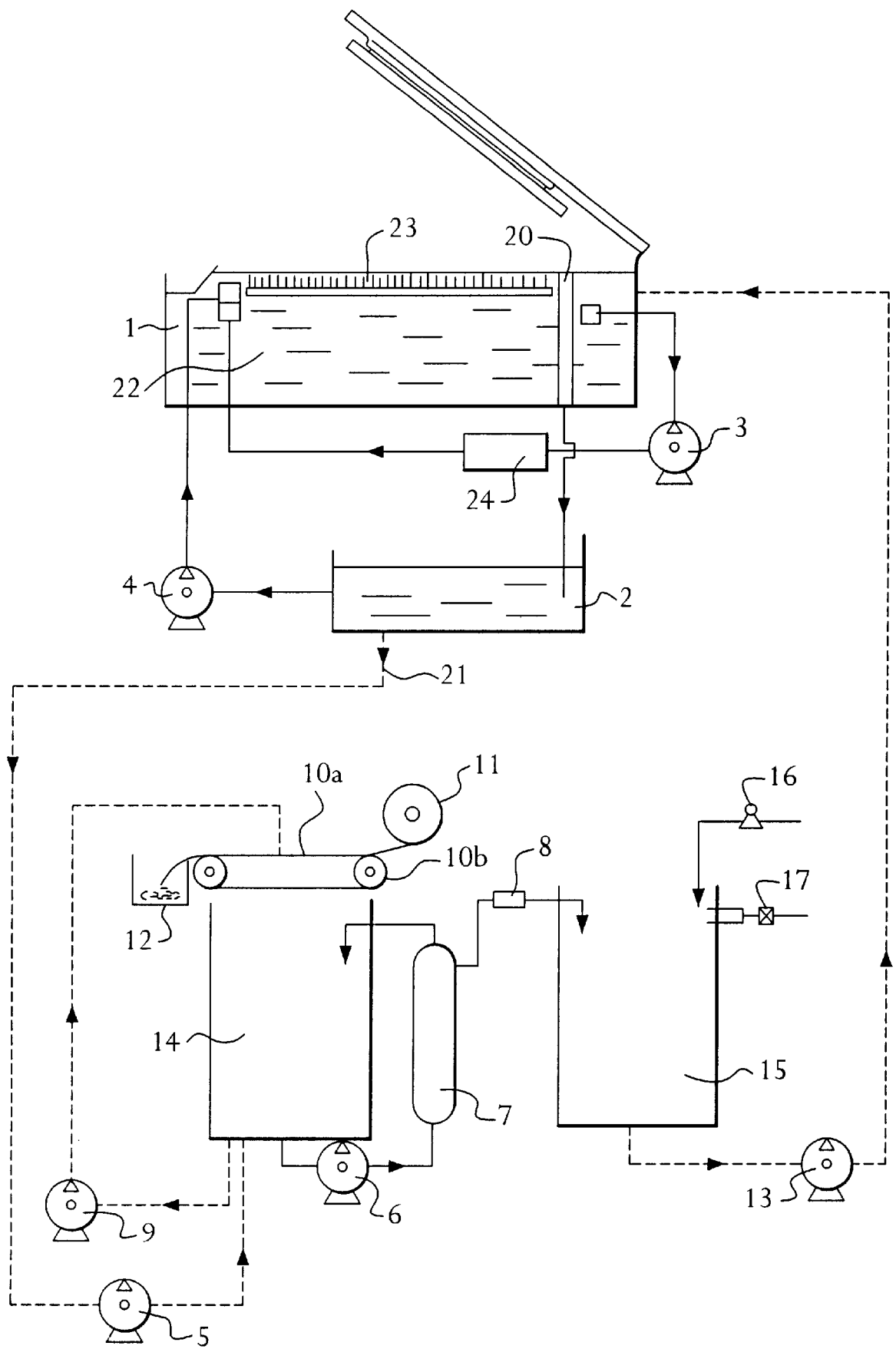

APPARATUS FOR THE COMPLETE, CONTINUOUS SEPARATION OF A MIXTURE OF PHOTOPOLYMERS AND WATER WITH A MEMBRANE AND FILTER, FOR THE MAKING OF FLEXIBLE PLATES USEFUL IN PRINTING

BACKGROUND OF THE INVENTION

The present invention relates to an improved etching machine for making a flexible block which can be used for printing in flexography, typography or dry offset, and the corresponding process for separating the components of the etching bath contained in the machine.

It is known that it is possible to obtain a block for flexography or typography by exposing a plate formed of a photopolymer sensitive to ultraviolet radiation. A negative film is used to expose those regions of the photopolymer which are to come into relief on the finished block to the radiation. This constitutes what is generally referred to as the exposure step.

The radiation cures the exposed regions and the material from the protected surface is subsequently removed by brushing the material from the plate using plane or rotary brushes or by spray nozzles using water plus a detergent which acts as wetting agent. The operation is continued until the regions which have been exposed are sufficiently in relief. This constitutes what is generally referred to as the etching step.

During the etching step, the water plus the detergent becomes loaded, then saturated with dissolved and/or suspended polymer particles. The etching bath therefore needs to be changed regularly.

A problem arises regarding the saturated aqueous solution, which needs to be treated in a treatment device independent of the etching machine. In particular, since treating the solution never allows all the polymer particles to be removed, a problem arises in terms of environmental protection.

A solution to this problem is proposed in FR 2,709,192. To this end, a device and a process are disclosed for preparing photopolymer blocks which can be used for printing in flexography, typography or dry offset, which includes the polymerization of desired regions by exposure to ultraviolet radiation, etching of the regions by exposure to ultraviolet radiation and etching of the unpolymerized regions by immersion and brushing in an etching vat. The disclosed device and process includes automatic and continuous separation of the etching bath, with the liquid obtained during such separation being automatically reinjected into the etching tank.

Even though the process and the device described in FR 2,709,192 are satisfactory, experience has shown that the filter belt which receives and filters the solution and which is discharged to a storage vat, can contain a significant quantity of contaminated aqueous solution. This contributes to the environmental problem described above.

SUMMARY OF THE INVENTION

According to the present invention, this problem is solved by preparing flexible blocks which can be used for printing in flexography, typography or dry offset, by polymerizing regions through exposure to ultraviolet radiation followed by etching of the unpolymerized regions by immersion and brushing in an etching bath contained in an etching vat.

In operation, the etching bath will become loaded with dissolved or suspended particles during the etching step. The components of the etching bath are then separated, and the liquid obtained during the separation bath are then separated, and is reinjected into the etching vat. Such separation is both automatic and continuous and the liquid obtained during the separation is automatically reinjected into the etching tank.

In accordance with the present invention, such separation is performed by filtration with progressive concentration of the water/polymer solution. This yields polymer particles in solid form, which are easier to treat (in ecological terms) than a liquid or semi-liquid product, as was previously the case, resulting in increased environmental friendliness.

The present invention is implemented, by non-limiting example, with an etching device for preparing flexible blocks which can be used for printing in flexography, typography or dry offset, including an etching tank containing a bath and brushes, a stirring and heating device, and an overfill system for discharging the solution from the etching tank through an outlet duct to a separation device. The separation device includes a reception vat having an upper part which is equipped with means for separating the water and the polymer, and with at least one filtering membrane.

The invention will be understood in greater detail with reference to the detailed description which follows, together with the appended drawing.

BRIEF DESCRIPTION OF THE DRAWING

The single FIGURE is a schematic diagram of an etching machine according to the present invention.

DETAILED DESCRIPTION OF A PREFERRED EMBODIMENT

The etching machine of the present invention includes an etching tank (1) containing a bath (22) and brushes (23).

The etching tank (1) includes an overfill system (20) which discharges the solution through an outlet duct (21) to the intermediate water tank (2). Solution from the intermediate water tank (2) is then drawn through the pump (5), to a separation device.

An intermediate tank (2) is provided which automatically operates continuously and in a closed-loop. The intermediate tank (2) receives the contaminated water arriving from the overfill (20) and discharges it through the outlet duct (21) to the separation device.

The separation device is mainly formed by a reception tank (14) having an upper part which is equipped with means (10) for separating the water and the polymer, and with at least one filtering membrane.

According to a preferred embodiment, the separation means (10) is a filter belt (10*a*) dispensed by a feed roller (11) and capable of being paid-out automatically by an advancing system (10*b*) having motorized rollers.

The filter belt (10*a*) continuously receives and filters the solution originating from the vat (14). When the belt (11) is saturated, the level of the solution rises, which raises a float forming a filter-saturation detector. The float then controls the advancing system (10*b*), which puts into place a new filter belt. The saturated belt is removed to a storage vat (12).

The filter product recovered in the reception vat (14) is pumped by a pump (9) and reinjected at the top of the filtration vat.

A slight level reduction in the etching vat is observed because of evaporation. It is easy to compensate for this evaporation by adding water into the intermediate tank (2), the volume of the vat (2) serving as a buffer volume.

The etching machine is further improved by the addition of a device for stirring and heating the solution of the bath. The stirring and heating device includes a circulating pump (3) and a heater (24). The stirring and heating device homogenizes the concentration of the solution in the bath, reducing the deposits of particles at the bottom of the vat and avoiding clogging of the brushes.

The reception vat (14) contains water and polymer in constant circulation so that the polymer is not deposited.

After the treatment of each etched plate, a volume of contaminated water is taken from the tank (2), using the pump (5), and is delivered to the reception vat (14). At the same time, the same volume of clean water is injected, by means of a pump (13) into the etching tank (1).

The high-pressure pump (6) takes in the contaminated water from the tank (14) and delivers the contaminated water into a filtering membrane (7). The number of filtering membranes (7) can be varied, and depends on the volume of water to be filtered (and therefore, the format of the etching machine).

A small flowrate of clean water is thus taken by "transpiration" at the filtering membrane (7) and is fed to the clogging indicator (8) associated with the membrane (7), for diversion into the clean-water tank (15). The major part of the output of the pump (6) is returned (more concentrated) to the tank (14).

The water and polymer solution therefore becomes progressively concentrated in the tank (14), where a photopolymer sludge gradually appears. The feed pump (9) of the filter (10), with the paper pay-out (11), takes in this sludge, which is filtered continuously. The filtered water falls back into the clean reservoir (15).

In fact, the clean reservoir (15) is situated downstream of the device in order to recover the water filtered by the filtering membrane or membranes (7).

The clogging indicator (8) is placed between the filtering membrane or membranes (7) and the clean tank (15).

The polymer remains on the filter paper (11) and the filter paper (11) is stored in the vat (12), to later be removed as waste.

The system may also include an automatic detergent feed (16) controlled by an analysis system (17), in order to recondition the clean water. The clean water, thus reconditioned, will be sent back into the etching tank via a clean-water pump (13).

The system of the present invention has, among other advantages, the elimination of liquid or semi-liquid residues, the discharge of solid residues, the rationalized use of water, which allows maximum water economy, the optimization of etching conditions, and a reduction in maintenance and upkeep costs.

What is claimed is:

1. In an etching device for preparing flexible blocks which can be used for printing in flexography, typography or dry offset, including an etching tank containing a bath and brushes, a stirring and heating device, and an overfill system for discharging solution containing water and polymer from the etching tank through an outlet duct to a separation device, the improved separation device which comprises:

a reception vat for receiving the solution containing the water and the polymer from the outlet duct of the overfill system, wherein the reception vat has an upper part which includes means for separating the water and the polymer, and at least one filtering membrane in fluid communication with the reception vat.

2. The etching device of claim 1 wherein the separation means includes a filter belt, a feed roller for dispensing the filter belt, and motorized rollers for engaging the filter belt.

3. The etching device of claim 1 wherein the motorized rollers are coupled with an advancing system, for automatically paying out the filter belt so that saturated portions of the filter belt are replaced with unsaturated portions.

4. The etching device of claim 3 which further includes a filter-saturation detector coupled with the advancing system, for automatically paying out the filter belt responsive to commands received from the filter-saturation detector.

5. The etching device of claim 1 which includes a single filtering membrane in fluid communication with the reception vat.

6. The etching device of claim 1 which includes a plurality of filtering membranes in fluid communication with the reception vat.

7. The etching device of claim 1 wherein the filtering membrane has a fluid inlet coupled with bottom portions of the reception vat, for receiving fluid from the reception vat, and a fluid return coupled with upper portions of the reception vat, for returning filtered fluid to the reception vat.

8. The etching device of claim 1 wherein the separating means and the filtering membrane are combined in a series combination.

9. The etching device of claim 1 which further includes a clean reservoir in fluid communication with and downstream of the filtering membrane, for receiving fluid filtered by the filtering membrane.

10. The etching device of claim 9 which further includes a membrane-clogging indicator positioned between the filtering membrane and the clean tank.

11. The etching device of claim 9 which further includes means attached to the clean tank, for feeding a detergent to the clean tank.

12. The etching device of claim 11 which further includes an analysis system coupled with the detergent feeding means and the clean tank, for controlling the feed of detergent to the clean tank.

13. The etching device of claim 1 which further includes an intermediate tank in communication with the overfill system and the separation device, for receiving contaminated fluid including the water and the polymer from the overfill system and for discharging the contaminated fluid through the outlet duct and to the separation device.

14. The etching device of claim 13 wherein the intermediate tank forms a closed loop with the overfill system and the separation device, for automatic and continuous operation.

15. The etching device of claim 1 wherein the stirring and heating device includes a circulating pump and a heater.

* * * * *